United States Patent [19]
Takeuchi

[11] Patent Number: 4,580,030

[45] Date of Patent: Apr. 1, 1986

[54] THICK FILM RESISTOR, METHOD OF TRIMMING THICK FILM RESISTOR, AND PRINTED CIRCUIT BOARD HAVING THICK FILM RESISTOR

[75] Inventor: Makoto Takeuchi, Yokohama, Japan

[73] Assignee: Victor Company of Japan, Ltd., Japan

[21] Appl. No.: 643,675

[22] Filed: Aug. 22, 1984

[30] Foreign Application Priority Data

Aug. 26, 1983 [JP] Japan ............................ 58-131998[U]
Aug. 26, 1983 [JP] Japan ............................ 58-131999[U]

[51] Int. Cl.⁴ ............................................ B23K 26/00
[52] U.S. Cl. ................................ 219/121 LJ; 338/195
[58] Field of Search ............... 338/195, 308, 309, 314; 219/121 LH, 121 LJ; 29/610 R

[56] References Cited

U.S. PATENT DOCUMENTS

| | | | |
|---|---|---|---|
| 3,388,461 | 6/1968 | Lins | 219/121 LB X |
| 3,758,745 | 9/1973 | Wilker et al. | 219/121 LB X |
| 3,827,142 | 8/1974 | Bennett et al. | 219/121 LM X |
| 3,947,801 | 3/1976 | Bubu | 219/121 LM X |
| 4,199,745 | 4/1980 | Barry | 338/320 |
| 4,381,441 | 4/1983 | Desmarais et al. | 219/121 LM X |
| 4,439,753 | 3/1984 | Madden, Jr. | 338/325 |

FOREIGN PATENT DOCUMENTS 2040591 8/1980 United Kingdom .

OTHER PUBLICATIONS

"The Performance and Application of Thick-Film Chip Resistors On PC Boards", by P. E. Johnston, 27th Electronic Components Conference, Stouffer's National Center Inn, Arlington, Va., May 16-18, 1977, pp. 109-115.

"Square Chip Resistors Accelerate Use of High-Density Mounting", Shigeru Kambara, 2209 J.E.E. Journal of Electronic Engineering, vol. 20 (1983) Jun., No. 198, Tokyo, Japan, pp. 68-69.

Primary Examiner—C. L. Albritton
Attorney, Agent, or Firm—Andrus, Sceales, Starke & Sawall

[57] ABSTRACT

A thick film resistor comprises a substrate made of a material which is uneasily damaged by a laser beam which impinges thereon, a resistor body formed on the substrate in the form of a thick film, and a pair of electrodes formed on the substrate. The electrodes are electrically connected to both ends of the resistor body, and the resistor body has a shape such that the substrate is exposed at least in a portion adjacent to one side edge of the resistor body.

12 Claims, 6 Drawing Figures

THICK FILM RESISTOR, METHOD OF TRIMMING THICK FILM RESISTOR, AND PRINTED CIRCUIT BOARD HAVING THICK FILM RESISTOR

BACKGROUND OF THE INVENTION

The present invention generally relates to thick film resistors, methods of trimming the thick film resistors, and printed circuit boards having the thick film resistors which are trimmed according to such methods. More particularly, the present invention relates to a thick film resistor which may be trimmed (subjected to a function trimming process) by irradiating a laser beam so as to adjust the resistance in a state where the thick film resistor is mounted on a printed circuit board, a method of trimming such a thick film resistor, and a printed circuit board having a thick film resistor which is trimmed according to such a method.

Generally, a thick film resistor is used as a miniature type resistor which is mounted on a printed circuit board. The thick film resistor is sometimes referred to as a chip resistor. The thick film resistor has a predetermined resistance when it is manufactured. However, when the thick film resistor is assembled on the printed circuit board together with other circuit parts, it is necessary to finely adjust the resistance of the thick film resistor so that the circuit as a whole has a predetermined characteristic in relation to the other circuit parts. The resistance of the thick film resistor is finely adjusted in a state where the thick film resistor is coupled to the circuit which is constituted by the other circuit parts, while measuring the resistance of the thick film resistor, or while measuring a voltage across a reference point and a predetermined point in the circuit which is located on the printed circuit board and is coupled to the thick film resistor. The former method of trimming the thick film resistor while measuring the resistance of the thick film resistor, is often referred to as an element trimming method. The latter method of trimming the thick film resistor while measuring the voltage across the reference point and the predetermined point in the circuit which is located on the printed circuit board until the measured voltage becomes equal to a predetermined voltage, is often referred to as a function trimming method. The trimming of the thick film resistor so as to finely adjust the resistance of the thick film resistor, is performed by removing a portion of a resistor body of the thick film resistor.

Conventionally, as a method of performing such a trimming process, there was a so-called sand-blast trimming method. According to the sand-blast trimming method, glass powder is blasted onto the resistor body by use of a nozzle, and a portion of the resistor body is scraped off by the friction between the glass powder and the resistor body. However, according to this sand-blast trimming method, a thin layer of the resistor body remains on a substrate of the resistor body after the trimming process is performed, and in this case, a crack is easily formed in this thin remaining layer of the resistor body. As a result, the resistance changes as the resistor body ages, and a drift is introduced in the current which passes through the resistor body. Thus, there is a problem in that it is impossible to accurately and finely adjust the resistance of the resistor body.

On the other hand, a laser trimming method was developed. According to the laser trimming method, a side surface of the resistor body which is trimmed, is approximately perpendicular to the substrate of the resistor body. Hence, compared to the sand-blast trimming method, it is possible to finely adjust the resistance of the resistor body with more accuracy. Therefore, the laser trimming method is the more popularly used method.

Conventionally, when using the sand-blast trimming method or the laser trimming method, the thick film resistor is placed on a trimming board. As will be described later on in the specification in conjunction with a drawing, the thick film resistor is electrically coupled to a printed circuit board (already having other circuit parts mounted thereon) on which the thick film resistor is to be mounted, by use of lead wires. Then, the resistor body of the thick film resistor is trimmed while measuring the voltage across a reference point and a predetermined point in a circuit which is located on the printed circuit board and is coupled to the thick film resistor.

In the conventional thick film resistor, the resistor body is formed over the full width of the substrate of the thick film resistor, and a pair of electrodes are provided on both ends of the resistor body. In addition, the energy of the laser beam is generally higher at a point when the laser beam first hits a target than the energy of the laser beam at a point thereafter. Thus, when the trimming process is performed by use of the laser trimming method in a state where the thick film resistor is mounted on the printed circuit board, for example, the resistor body of the thick film resistor is subjected to a rapid temperature change at a predetermined portion where the laser beam first impinges on the resistor body and at a portion in the vicinity of the predetermined portion. For this reason, a crack is formed in the vicinity of the predetermined portion where the laser beam first impinges on the resistor body, and it is impossible to perform an accurate and stable trimming of the resistor body.

When the thick film resistor is mounted on the printed circuit board and the position where the laser beam first impinges is selected to a position on the printed circuit board, the printed circuit board generally cannot withstand the laser beam because the printed circuit board is usually made of paper-phenolic plastic. As a result, the printed circuit board becomes damaged at the portion where the laser beam impinges. For this reason, as described before, there was a method of trimming the resistor body of the thick film resistor by placing the thick film resistor on the trimming board which is made of a material which will not be damaged by the laser beam which impinges thereon, and by selecting the position where the laser beam first impinges to a position on the trimming board. According to this method, the trimming process is performed in the state where the thick film resistor is placed on the trimming board.

The thick film resistor which is subjected to the trimming process, is disconnected of the lead wires, and is removed from the trimming board. The thick film resistor is then mounted at a predetermined position on the printed circuit board, and is permanently fixed to the printed circuit board by soldering.

However, according to the conventional thick film resistor and the conventional method of trimming the resistor body of the thick film resistor, the trimming process must be performed in the state where the thick film resistor is placed on the trimming board. Further, the thick film resistor which is subjected to the trimming process, must then be mounted on the printed circuit board. Hence, the operations of trimming and mounting the thick film resistor are troublesome to perform, and the productivity of the thick film resistor is accordingly poor. Therefore, there is a disadvantage in that it is impossible to manufacture the printed circuit board which is mounted with the thick film resistor, at a low cost.

On the other hand, there is a so-called hybrid integrated circuit (IC) or the like in which the resistor body and the electrodes of the thick film resistor are printed, together with other wirings, on a circuit board which is made of ceramics and is mounted with ICs or the like. The ceramic circuit board will not be damaged by the laser beam. Hence, the position where the laser beam first impinges may be selected to a position on the ceramic circuit board, and the resistor body is trimmed by moving the laser beam. According to this method, there is an advantage in that the thick film resistor which is subjected to the trimming process, need not be moved and mounted on the circuit board, as in the case of the conventional method described before. However, the ceramic circuit board is fragile. Moreover, the ceramic circuit board is expensive compared to the plastic circuit board, since ceramics is used for the main plate body. In addition, the ceramic circuit board must be subjected to processes such as printing, baking, and molding, and the manufacturing cost of the ceramic circuit board is high also due to the large number of manufacturing processes. Furthermore, when the trimming of the resistor body is imperfect, the whole ceramic circuit board must be destroyed as being defective, since the thick film resistor is printed on the ceramic circuit board and cannot be removed from the ceramic circuit board. Thus, in addition to the fragility of the ceramic circuit board, the yield of nondefective ceramic circuit boards is poor, and the manufacturing cost of the ceramic circuit board is high also from these points of view.

SUMMARY OF THE INVENTION

Accordingly, it is a general object of the present invention to provide a novel and useful thick film resistor, a method of trimming such a thick film resistor, and a printed circuit board having a thick film resistor which is trimmed according to such a method.

Another and more specific object of the present invention is to provide a thick film resistor which is designed so that the thick film resistor may be subjected to a trimming process by a laser beam in a state where the thick film resistor is mounted on a printed circuit board.

Still another object of the present invention is to provide a method of trimming a thick film resistor in a state where the thick film resistor is mounted on a printed circuit board.

A further object of the present invention is to provide a printed circuit board mounted with a high-temperature glass coated thick film resistor which is subjected to a trimming process by a laser beam in a state where the thick film resistor is mounted on the printed circuit board, and is then subjected to a low-temperature resin coating.

Other objects and further features of the present invention will be apparent from the following detailed description when read in conjunction with the accompanying drawings.

DETAILED DESCRIPTION

Figure 1:
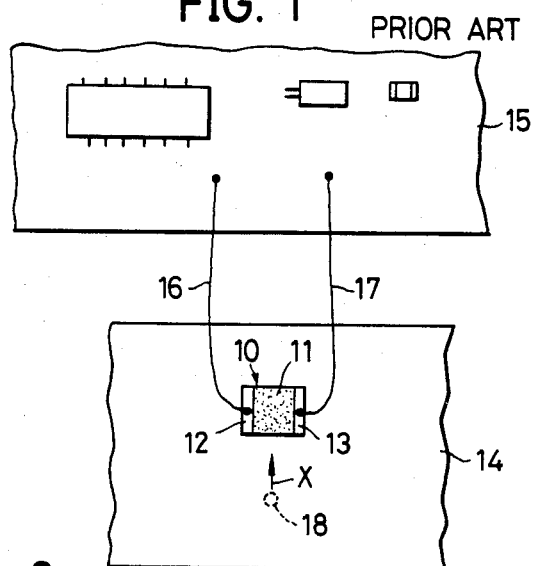
FIG. 1 is a diagram for explaining an example of a conventional method of trimming a thick film resistor.

First, description will be given with respect to an example of a conventional method of trimming a thick film resistor. A conventional thick film resistor 10 has a thick film resistor body 11 which is formed over the full width of a ceramic substrate, and a pair of electrodes 12 and 13 are formed on both ends of the resistor body 11. When trimming the resistor body 11, the thick film resistor 10 is placed at a predetermined position on a trimming board 14. The trimming board 14 is made of a material which will not be damaged by a laser beam which impinges thereon. A printed circuit board 15 which is already mounted with electrical parts other than the thick film resistor 10, is disposed near the trimming board 14, and the electrodes 12 and 13 of the thick film resistor 10 are coupled to terminals of the printed circuit board 15 through respective lead wires 16 and 17. Accordingly, the thick film resistor 10 is electrically coupled to the printed circuit board 15, and a circuit constituted by the thick film resistor 10 and the printed circuit board 15 is essentially the same as if the thick film resistor 10 is actually mounted on the printed circuit board 15.

Next, a laser beam impinges on the trimming board 14 at a starting point 18, and the laser beam is gradually moved in the direction of an arrow X. The laser beam impinges on one side edge of the resistor body 11, and a portion of the resistor body 11 is melted and evaporated. As a result, this portion of the resistor body 11 is removed. When subjecting the resistor body 11 to the laser trimming process, the printed circuit board 15 is coupled to a measuring apparatus (not shown), and the trimming process is performed while measuring a voltage across a reference point and a predetermined point in a circuit which is located on the printed circuit board 15 and is coupled to the thick film resistor 10. The trimming process is performed until the voltage measured by the measuring apparatus becomes equal to a predetermined voltage. As the resistor body 11 is trimmed and a portion of the resistor body 11 is removed, the resistance of the thick film resistor 10 increases. When the resistance of the thick film resistor 10 increases to a predetermined resistance, the voltage measured by the measuring apparatus becomes equal to the predetermined voltage, and the trimming process is terminated.

After the thick film resistor 10 is subjected to the trimming process, the lead wires 16 and 17 coupling the electrodes 12 and 13 of the thick film resistor 10 to the terminals of the printed circuit board 15, are disconnected. Then, the thick film resistor 10 is removed from the trimming board 14, and is mounted at a predetermined position on the printed circuit board 15. The thick film resistor 10 is permanently fixed on the printed circuit board 15 by soldering.

Generally, a paper-phenolic plastic plate, a glass-epoxy resin plate, a flexible plate, or the like, which are easily damaged by the impinging laser beam, are used for the main plate body of the printed circuit board 15. Accordingly, when the laser trimming process is performed in a state where the thick film resistor 10 is already mounted on the printed circuit board 15, by first irradiating the laser beam at a starting point on the printed circuit board 15 and then moving the laser beam so as to impinge the laser beam on the resistor body 11 of the thick film resistor 10, the printed circuit board 15 will be damaged by the laser beam. On the other hand, when the laser beam is first irradiated at a starting point which is located on the resistor body 11 of the thick film resistor 10, a large crack is formed in the vicinity of the starting point on the resistor body 11, because the energy of the laser beam is extremely large at first as described before. Thus, an accurate trimming process cannot be performed when the starting point is located on the resistor body 11. For these reasons, according to the conventional method, trimming process is performed in a state where the thick film resistor 10 is placed on the trimming board 14.

In addition, although not shown in the drawings, there was another conventional method of trimming the thick film resistor. According to this other method, the thick film resistor is printed on a ceramic circuit board which is to be mounted with circuit parts. The laser beam is first irradiated at a starting point on the ceramic circuit board, and the trimming process is performed by moving the laser beam. However, as described before, the cost of such ceramic circuit board is high since the main plate body is made of ceramics. Further, the ceramic circuit board is fragile. Further, when the trimming is imperfect, it is impossible to replace the thick film resistor, and the whole ceramic circuit board must be destroyed as being a defective. As a result, there is a disadvantage in that the manufacturing cost of the ceramic circuit board is high.

Figure 2:
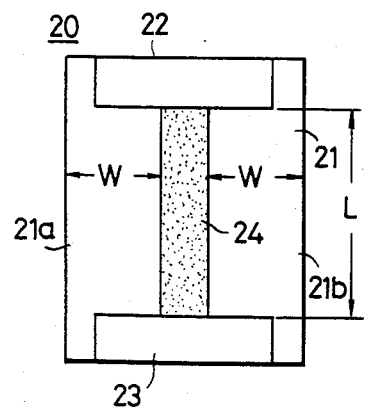
FIG. 2 is a plan view showing an embodiment of a thick film resistor according to the present invention.

The present invention has eliminated the conventional disadvantages described heretofore, and description will now be given with respect to an embodiment by referring to FIG. 2. FIG. 2 is a plan view showing an embodiment of a thick film resistor according to the present invention. In FIG. 2, a thick film resistor 20 comprises a ceramic substrate 21, a a pair of electrodes 22 and 23 which are printed on the ceramic substrate 21, and a resistor body 24 which is printed between the electrodes 22 and 23 and is electrically connected to the electrodes 22 and 23. Exposed parts 21a and 21b where no resistor body is formed on the ceramic substrate 21, are formed on both sides of the resistor body 24. The exposed parts 21a and 21b have a width W which is selected by taking into account the precision with which the thick film resistor 20 is mounted on a printed circuit board. The mounting of the thick film resistor 20 will be described later on in the specification. For example, in a case where the mounting precision is in the order of ±0.3 mm, the width W is selected to W=0.3×2+0.15=0.75 mm, by reserving some margin. The resistor body 24 has a length L. This length L depends on the manner in which the resistor body 24 is trimmed, however, in the present embodiment, the length L is selected to 1.3 mm, for example. The width and thickness of the film of the resistor body 24, are selected so that a predetermined resistance is obtained.

When manufacturing the thick film resistor 20, the electrodes 22 and 23 and the resistor body 24 are printed on the ceramic substrate 21. Then, the top surface of the entire thick film resistor 20 is covered by a high-temperature glass paste having a composition which will be described later on in the specification. The high-temperature glass paste is melted and evaporated, so as to form a coating on top of the thick film resistor 20.

Figure 3:
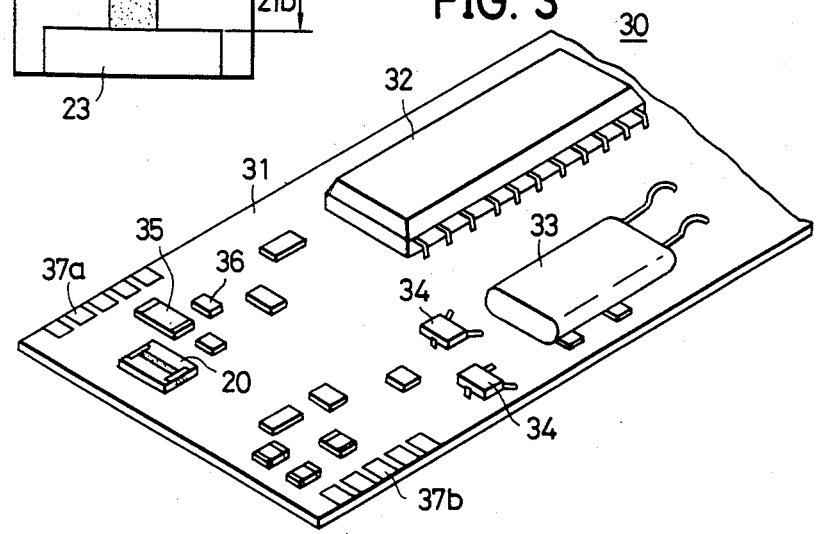
FIG. 3 is a perspective view showing an embodiment of a printed circuit board which is mounted with a thick film resistor according to the present invention.

When mounting the thick film resistor 20 on a printed circuit board 30 shown in FIG. 3, each land on a main plate body 31 which is already printed with wirings, is printed and coated with creamed solder. Next, ordinary electrical circuit parts such as an IC 32, a capacitor 33, transistors 34, and a thick film resistor 36 which does not need to be trimmed, are mounted on the main plate body 31. For example, the main plate body 31 is made of an inexpensive material such as paper-phenolic plastic which is easily damaged by laser beam.

Figure 6:
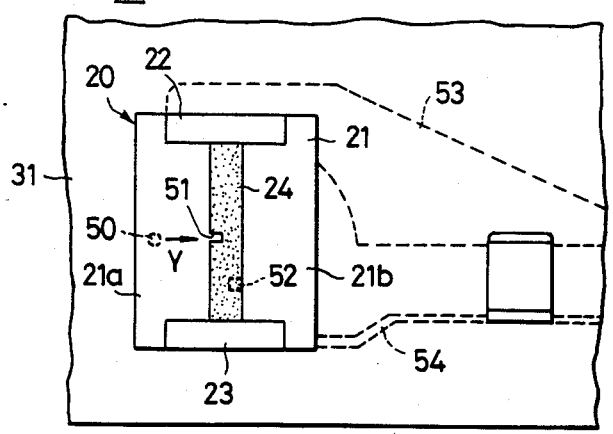
FIG. 6 is a plan view showing a thick film resistor shown in FIG. 3 after the trimming process is performed.

Next, a vacuum pincette of an automatic mounting apparatus attracts the thick film resistor 20, and places the thick film resistor 20 on a land which is coated with the creamed solder and is located at a predetermined position on the main plate body 31. Other thick film resistors 35 and 36 or the like which do not need to be trimmed, are similarly placed on respective lands located on the main plate body 31. The thick film resistors adhere to the creamed solder, and will not move from the respective predetermined positions. Next, the main plate body 31 having these thick film resistors placed thereon, is passed through a high-temperature bath so as to reflow the creamed solder and fix the thick film resistors to the respective lands. As a result, the circuit on the printed circuit board 30 is completed. FIG. 6 shows one thick film resistor 20 in an enlarged scale. As shown in FIG. 6, the thick film resistor 20 is electrically connected to predetermined conductor patterns 53 and 54 on the main plate body 31, through the land on which the thick film resistor 20 is mounted.

Figure 4:
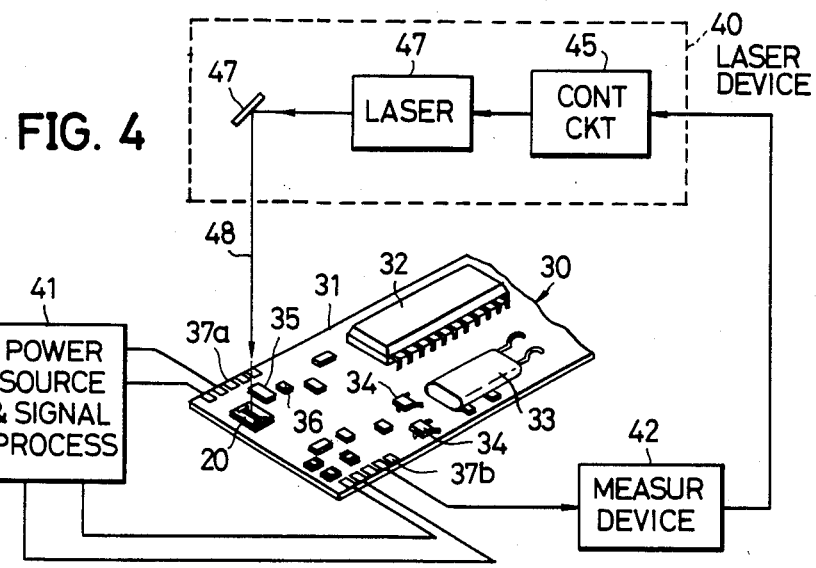
FIG. 4 is a general system diagram showing a trimming apparatus capable of carrying out an embodiment of a method of trimming a thick film resistor according to the present invention.
Figure 5:
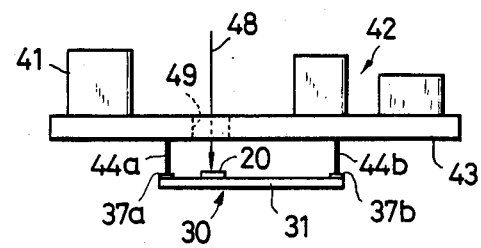
FIG. 5 is a side view showing a base mounted with a measuring apparatus and the like which cooperate with a laser trimming apparatus.

When trimming the thick film resistor 20 which is mounted on the printed circuit board 30 as described heretofore, the printed circuit board 30 is arranged at a position below a laser trimming apparatus 40 which is shown conceptually in FIG. 4. The height position of a base (not shown) on which the printed circuit board 30 is placed, is determined by a reference pin, and the printed circuit board 30 is held down so that the printed circuit board 30 lies on a flat plane by correcting the bends in the main plate body 31.

Next, an interface base 43 which is mounted with the electrical circuit, a signal processing circuit 41, and the entire or a part of a measuring apparatus 42, is lowered so that terminal pins 44a and 44b projecting from the lower surface of the interface base 43 make contact with terminals 37a and 37b of the printed circuit board 30. Thus, the terminal pins 44a and 44b are electrically connected to the respective terminals 37a and 37b of the printed circuit board 30. In addition to a power source voltage, the signal processing circuit 41 supplies a signal having the waveform of a video signal, for example, to the printed circuit board 30. The measuring apparatus 42 detects an a.c. signal waveform of an a.c. voltage across a reference point and a predetermined point in the circuit on the printed circuit board 30, and converts the detected a.c. voltage into a d.c. voltage. When the measured result in the measuring apparatus 42 indicates that the voltage across the reference point and the predetermined point in the circuit on the printed circuit board 30 has not reached a predetermined voltage, a laser beam is emitted from a laser 46 under the control of a control circuit 45 of the laser trimming apparatus 40, responsive to an operation of starting the trimming process. The laser beam is reflected by a beam scanner 47, and is irradiated on the thick film resistor 20 as a trimming laser beam 48, through a hole 49 in the interface base 43.

As shown in FIG. 6, a point 50 where the laser beam 48 first impinges on the thick film resistor 20, is located on the exposed part 21a of the ceramic substrate 21. For this reason, the laser beam 48 will not impinge on and damage the main plate body 31 of the printed circuit board 30. In addition, since the substrate 21 is made of ceramics, the substrate 21 will not be damaged by the laser beam 48 which impinges thereon. Next, the beam scanner 47 is rotated so as to move the spot of the laser beam 48 in the direction of an arrow Y from the point 50. As a result, the side edge of the resistor body 24 is gradually melted and evaporated, and a portion of the resistor body 24 is removed by this laser trimming process. For example, the diameter of the spot of the laser beam 48 is in the range of 40 $\mu$m. As a portion of the resistor body 24 is removed and a removed portion 51 becomes larger, the resistance of the thick film resistor 20 becomes larger. When the measuring apparatus 42 detects that the voltage across the reference point and the predetermined point in the circuit on the printed circuit board 30 has reached a first predetermined voltage, a detection signal is supplied to the control circuit 45 from the measuring apparatus 42 so as to stop the laser 46 from emitting the laser beam. Similarly thereafter, a starting point where the laser beam 48 is to first impinge on the thick film resistor 20, is selected to a point on the other exposed part 21b of the ceramic substrate 21. The other side edge of the resistor body 24 is removed by the laser trimming process, and a removed portion 52 is formed. When the measuring apparatus 42 detects that the voltage across the reference point and the predetermined point in the circuit on the printed circuit board 30 has reached a second predetermined voltage, a detection signal is supplied to the control circuit 45 from the measuring apparatus 42 so as to stop the laser 46 from emitting the laser beam, and the laser trimming process is completed.

Essential parts of the measuring apparatus 42 and the control circuit 45, may be constituted by a microcomputer. In this case, the laser trimming process is performed according to predetermined programs of the microcomputer.

The printed circuit board 30 having the thick film resistor 20 which is already subjected to the laser trimming process, is then subjected to a subsequent process. In the subsequent process, a low-temperature resin is dropped on the thick film resistor 20 which is already subjected to the laser trimming process by a dispenser. An infrared ray is irradiated on the low-temperature resin so as to dry and harden the low-temperature resin, and as a result, a low-temperature resin coating is formed on top of the thick film resistor 20. Accordingly, the side edges of the resistor body 24 in the vicinity of the removed portions 51 and 52 where portions of the high-temperature glass coating are destroyed by the laser trimming process, are covered by the low-temperature resin coating.

By the processes desribed heretofore, it is possible to obtain a printed circuit board mounted with a thick film resistor which is subjected to the laser trimming process.

The trimming of the resistor body 24 need not necessarily be performed from both side edges of the resistor body 24. For example, the trimming of the resistor body 24 may be performed only from one side edge of the resistor body 24. However, because the rate at which the resistance changes becomes large as the length of the removed portion becomes longer, it is desirable to trim the resistor body 24 from both side edges thereof in order to perform an accurate trimming process. In addition, the removed portions may be formed at two locations on one side edge of the resistor body 24. However, in order to effectively use the area over which the current flows through the resistor body 24, it is desirable to form the removed portions on both side edges of the resistor body 24. In the case where the removed portion is only formed on one side edge of the resistor body 24, it is unnecessary to provide the exposed parts 21a and 21b on both sides of the resistor body 24, and it is sufficient to provide only one of the exposed parts 21a and 21b.

Next, description will be given with respect to the high-temperature glass coating which is formed on top of the thick film resistor 20 before the thick film resistor 20 is subjected to the trimming process. The high-temperature glass coating is formed on top of the thick film resistor 20 so as to protect the resistor body 24, prevent oxidization of the resistor body 24, and prevent damage to the resistor body 24 when the thick film resistor 20 is attracted by the vacuum pincette. Due to the provision of this high-temperature glass coating, the resistor body 24 is pressed downwardly by the high-temperature glass coating, and the chances of a crack being formed in the resistor body 24 by the laser trimming process are small. In addition, the heat which is generated during the trimming process, is absorbed by a substance within the glass composition, such as boric acid ($B_2O_3$), which absorbs the thermal neutron. Hence, the undesirable effects of the heat is effectively prevented from spreading.

The baked electrodes have a poor resistance against the erosion by the solder. For this reason, the baked electrodes must be plated with nickel (Ni) and thereafter plated with tin (Sn) or solder, so as to improve the resistance against the erosion by the solder. However, when the baked electrodes are subjected such plating processes, portions of the glass coating which is formed thereafter, easily melt or separate from the plated electrodes. Accordingly, in the present invention, the glass composition of the glass paste which is used for the high-temperature glass coating, is selected as follows. In other words, the glass paste comprises 45% to 60% by weight of minium PbO, 20% to 35% by weight of quartz $SiO_2$, 5% to 15% by weight of boric acid $B_2O_3$, and 2% to 10% by weight of aluminium oxide $Al_2O_3$, which make up 95% by weight. When the quantity of minium PbO falls below the lower limit of the above range, the softening point of glass rises, and the acid resistance becomes poor when the quantity of minium PbO is excessively large. The boric acid $B_2O_3$ acts to lower the melting point of glass. When the quantity of the boric acid $B_2O_3$ is excessively large, the acid resistance becomes poor. When the quantity of the boric acid $B_2O_3$ is less than 5% by weight, the melting point of glass which is required upon vitrifaction becomes high, and it is difficult to obtain a uniform glass. The quartz $SiO_2$ raises the softening point when the quantity thereof exceeds the upper limit of the above range, and the acid resistance becomes poor when the quantity of the quartz $SiO_2$ falls below the lower limit of the above range. The aluminium oxide $Al_2O_3$ and the quartz $SiO_2$ have similar characteristics.

The percent by weight of each of the substances described above, are determined so that optimum conditions are set with respect to baking temperature and acid resistance. The baking temperature must be set in the range of 400° C. to 600° C., and in the present embodiment, the baking temperature is set in the range of 800° C. by taking into account the acid resistance. When the baking temperature is set to 400° C. or less, the conductor Ag-Pd becomes oxidized, and the resistance of the conductor part becomes large. On the other hand, when the baking temperature is set to a temperature greater than 600° C., the resistance of the resistor body changes greatly.

The glass paste is obtained by mixing glass powder including the substances described above, and vehicle. An organic solvent containing dissolved cellulose, is appropriate for the vehicle. The glass paste used in the present embodiment, is adjusted so that the thickness of the glass layer upon baking is thin compared to the layer formed by the ordinary paste, by reducing the content of the glass powder. The coloring of the glass paste is made by an inorganic pigment. Normally, the appropriate content of the inorganic pigment is 0.5% to 15% by weight.

By using the high-temperature glass paste having the composition described heretofore, the thickness of the glass coating which is obtained, is suited for the baking process. Moreover, the reliability of the protection of the resistor body by this glass coating is high.

When a low-temperature resin coating is used instead of the high-temperature glass coating, the low-temperature resin coating will be carbonized by the laser beam during the trimming process, and carbide will adhere onto the resistor body and bring undesirable results. Hence, it is impossible to use the low-temperature resin coating before the resistor body is subjected to the trimming process. In addition, there is a coating material which is used for the purpose of water-proofing semiconductors or the like. However, this coating material is constituted by sulfur, selenium, and the like, and has a softening temperature which is extremely low (under 100° C.). Therefore, this coating material cannot be used in the thick film resistor of the present invention.

According to the present invention, the trimming process is performed in a state where the thick film resistor is mounted on the printed circuit board and is coupled to and assembled on the circuit on the printed circuit board. Hence, it is unnecessary to perform the troublesome operation of trimming the thick film resistor on a trimming board and then moving the thick film resistor on the printed circuit board as in the conventional case described before. As a result, the productivity of the thick film resistor according to the present invention is high. Further, the laser beam which is used for the trimming process, first impinges on the exposed part of the ceramic substrate of the thick film resistor, and the laser beam does not impinge on the main plate body of the printed circuit board. Thus, the printed circuit board will not be damaged by the laser beam. This means that the main plate body of the printed circuit board can be made of an inexpensive material which is easily damaged by the laser beam, such as paper-phenolic resin, glass-epoxy resin, and flexible plate. Therefore, it is possible to manufacture the printed circuit board having the thick film resistor which is already subjected to the trimming process, at an extremely low cost. In addition, even in a case where the trimming is imperfect, the solder may be melted and removed, so as to remove and replace the defective thick film resistor on the printed circuit board by a new thick film resistor. In this case, the trimming process is performed with respect to the new thick film resistor which is mounted on the same printed circuit board. In the conventional case described before where the thick film resistor is printed on the ceramic circuit board, the whole ceramic circuit board must be destroyed as being defective when the trimming is imperfect, but such waste is prevented according to the present invention.

Further, the present invention is not limited to these embodiments, but various variations and modifications may be made without departing from the scope of the present invention.

What is claimed is:

1. A thick film resistor which is to be mounted on a first substrate, said thick film resistor comprising:
   a second substrate made of a material which is not easily damaged by a laser beam impinging thereon;
   a single resistor body formed on said second substrate in the form of a thick film;
   a pair of electrodes formed on said second substrate, said electrodes being electrically connected to both ends of said single resistor body which is formed between said pair of electrodes;
   a first coating for covering tops of said resistor body and said electrodes before said thick film resistor is subjected to a trimming process in which a part of said resistor body is removed by a laser beam, said first coating being a high temperature glass coating; and
   a second coating for covering said resistor body and said first coating after said resistor body is subjected to said trimming process,
   said single resistor body having such a shape that said second substrate is exposed in an exposed part which is adjacent to at least one side edge of said single resistor body, said exposed part having a dimension in accordance with a precision of mounting said thick film resistor on said first substrate so that the laser beam first impinges on said exposed part in the trimming process which is carried out in a state where said thick film resistor is directly mounted on said first substrate.

2. A thick film resistor as claimed in claim 1 in which said high-temperature glass comprises 45% to 60% by weight of minimum PbO, 20% to 35% by weight of quartz $SiO_2$, 5% to 15% by weight of boric acid $B_2O_3$, and 2% to 10% by weight of aluminum oxide $Al_2O_3$.

3. A thick film resistor as claimed in claim 1 in which said exposed part has a size such that a beam spot of the laser beam will not protrude from said exposed part.

4. A thick film resistor as claimed in claim 1 in which said thick film resistor is mounted on a printed circuit board comprising said first substrate and electrical circuitry mounted thereon, said thick film resistor being coupled to the circuitry on said printed circuit board and then being subjected to said trimming process.

5. A thick flim resistor as claimed in claim 4 in which said resistor body is subjected to said trimming process so that said resistor body has a predetermined resistance which causes the circuitry on said printed circuit board to have predetermined function and characteristic.

6. A thick film resistor as claimed in claim 4 in which said resistor body is subjected to said trimming process so that said resistor body has a predetermined resistance which causes a voltage across a reference point and a predetermined point in the circuitry on said printed circuit board to assume a predetermined voltage.

7. A thick film resistor as claimed in claim 4 in which said thick film resistor is electrically coupled to the electrical circuitry through conductors which are printed on one side of said first substrate, said thick film resistor being directly mounted on the other side of said first substrate.

8. A method of trimming a thick film resistor, said method comprising:

a first step of directly mounting said thick film resistor on a first substrate which is printed with conductors and is mounted with electrical circuit parts, said first substrate being made of a material susceptible to a leaser beam, said conductors electrically coupling said thick film resistor to said electrical circuit parts when said thick film resistor is mounted on said first substrate, said thick film resistor comprising a second substrate made of a material which is not easily damaged by a laser beam which impinges thereon, a single resistor body formed on said second substrate in the form of a thick film, said resistor body having such a shape that said second substrate is exposed at least in an exposed part which is adjacent to at least one side edge of said resistor body, a pair of electrodes formed on said second substrate so as to be connected to both ends of said resistor body, and a high-temperature glass coating for covering tops of said resistor body and said electrodes;

a second step of trimming and removing a part of said resistor body of said thick film resistor which is mounted on said first substrate, by applying a laser beam to said part of said resistor body, said exposed part having a dimension in accordance with a precision of mounting said thick film resistor on said first substrate in said first step so that said laser beam first impinges on said exposed part in said second step; and a third step of coating a low-temperature resin coating on top of said thick film resistor which subjected to the trimming.

9. A method of trimming a thick film resistor as claimed in claim 8 in which said first step mounts said thick film resistor on one side of said first substrate, said one side of said first substrate being opposite to a side on which said conductors are printed.

10. A method as claimed in claim 8 in which said second step comprises a first substep of coupling a circuit for supplying a power source voltage and a signal and a measuring apparatus for measuring a characteristic of the circuit on said first substrate to said first substrate which is mounted with said thick film resistor, and a second substep of trimming and removing a part of said resistor body by the leaser beam while measuring the characteristic of the circuit on said first substrate by said measuring apparatus.

11. A method as claimed in claim 10 in which said second substep trims and removes the part of said resistor body while said measuring apparatus measures a voltage across a reference point and a predetermined point in the circuit on said first substrate, and stops the trimming of said resistor body when the measured voltage becomes equal to a predetermined voltage.

12. A printed circuit board characterized by being constituted by said first substrate and mounted with a thick film resistor which is trimmed according to the method of claim 8.

* * * * *